United States Patent
Fursin et al.

(10) Patent No.: US 9,331,068 B2
(45) Date of Patent: May 3, 2016

(54) HYBRID WIDE-BANDGAP SEMICONDUCTOR BIPOLAR SWITCHES

(71) Applicant: United Silicon Carbide, Inc., Monmouth Junction, NJ (US)

(72) Inventors: Leonid Fursin, Monmouth Junction, NJ (US); Anup Bhalla, Princeton Junction, NJ (US)

(73) Assignee: United Silicon Carbide, Inc., Monmouth Junction, NY (US)

( * ) Notice: Subject to any disclaimer, the term of this patent is extended or adjusted under 35 U.S.C. 154(b) by 0 days.

(21) Appl. No.: 14/528,140

(22) Filed: Oct. 30, 2014

(65) Prior Publication Data

US 2015/0115289 A1  Apr. 30, 2015

Related U.S. Application Data

(60) Provisional application No. 61/897,411, filed on Oct. 30, 2013.

(51) Int. Cl.
| | |
|---|---|
| *H01L 27/06* | (2006.01) |
| *H01L 29/78* | (2006.01) |
| *H01L 29/808* | (2006.01) |
| *H01L 29/861* | (2006.01) |
| *H01L 29/739* | (2006.01) |
| *H01L 21/82* | (2006.01) |
| *H01L 23/495* | (2006.01) |
| *H01L 29/16* | (2006.01) |
| *H01L 29/20* | (2006.01) |

(52) U.S. Cl.
CPC ........ *H01L 27/0635* (2013.01); *H01L 21/8213* (2013.01); *H01L 23/49562* (2013.01); *H01L 23/49575* (2013.01); *H01L 27/0623* (2013.01); *H01L 29/7395* (2013.01); *H01L 29/78* (2013.01); *H01L 29/808* (2013.01); *H01L 29/861* (2013.01); *H01L 29/1608* (2013.01); *H01L 29/2003* (2013.01); *H01L 2224/32225* (2013.01); *H01L 2224/73265* (2013.01); *H01L 2924/13055* (2013.01)

(58) Field of Classification Search
CPC ............ H01L 27/0635; H01L 21/8213; H01L 23/49562; H01L 23/49575; H01L 27/0623
USPC .......................................................... 257/77
See application file for complete search history.

(56) References Cited

U.S. PATENT DOCUMENTS

| | | | |
|---|---|---|---|
| 4,663,547 A | 5/1987 | Baliga | |
| 4,945,266 A | 7/1990 | Mori | |
| 5,014,102 A | 5/1991 | Adler | |
| 5,396,085 A | 3/1995 | Baliga | |
| 7,719,055 B1 | 5/2010 | McNutt et al. | |
| 2011/0199148 A1 | 8/2011 | Iwamura | |
| 2012/0199875 A1* | 8/2012 | Bhalla ................. | H01L 27/0629 257/134 |
| 2013/0014384 A1* | 1/2013 | Xue et al. ......... | 29/825 |
| 2013/0155736 A1* | 6/2013 | Ilic et al. .......... | 363/71 |
| 2015/0041984 A1* | 2/2015 | Otremba et al. .... | 257/773 |

\* cited by examiner

*Primary Examiner* — Karen Kusumakar
*Assistant Examiner* — Adam S Bowen
(74) *Attorney, Agent, or Firm* — Baker & Hostetler LLP

(57) ABSTRACT

A hybrid semiconductor bipolar switch in which a normally-on high-voltage wide-bandgap semiconductor bipolar switch and a normally-off field effect transistor are connected in a cascode (Baliga-pair) configuration. The switch may be constructed as a stacked hybrid device where a discrete transistor is bonded on top of a bipolar switch. Power systems may use plural switches paired with anti-parallel diodes.

8 Claims, 4 Drawing Sheets

HYBRID WIDE-BANDGAP SEMICONDUCTOR BIPOLAR SWITCHES

CROSS REFERENCE TO RELATED APPLICATIONS

This Application claims the benefit of U.S. Provisional Patent Application Ser. No. 61/897,411 (Fursin, et al.) filed Oct. 30, 2013, entitled "Hybrid Wide-Bandgap Semiconductor Bipolar Switches," the disclosure of which is hereby incorporated by reference in its entirety.

BACKGROUND

Bipolar semiconductor switches, such as IGBTs and thyristors, may be made of wide-bandgap materials, such as silicon carbide (SiC), gallium nitride (GaN), and/or diamond, among others. Such devices are used for power conversion and management applications, such as inverters (e.g., for grid-tied renewable energy such as photovoltaic arrays), high-voltage direct current transmission, and motor drives for traction and propulsion, to name but a few.

SUMMARY

A hybrid switch may be constructed using a normally-off low-voltage field-effect transistor (FET) to control a high-voltage normally-on bipolar switch in a cascode (Baliga-pair) configuration. The bipolar switch may be an insulated-gate bipolar transistor (IGBT), a thyristor, or a similar device. The bipolar switch may be made of one or more wide-bandgap semiconductors such as silicon carbide (SiC.) The FET may be a wide-bandgap (e.g., SiC) or narrow-bandgap (e.g., silicon) device. The hybrid switch may be formed, for example, either by creating the FET and the bipolar switch on a single die monolithically, or as discrete component chips which are then directly or indirectly bonded and/or wired together. Such hybrid switches may be paired with antiparallel diodes for use in, for instance, power switches, rectifiers, inverters, and converters.

This summary is provided to introduce a selection of concepts in a simplified form that are further described below in the detailed description. This summary is not intended to identify key features or essential features of the claimed subject matter, nor is it intended to be used to limit the scope of the claimed subject matter.

DETAILED DESCRIPTION

Figure 1:
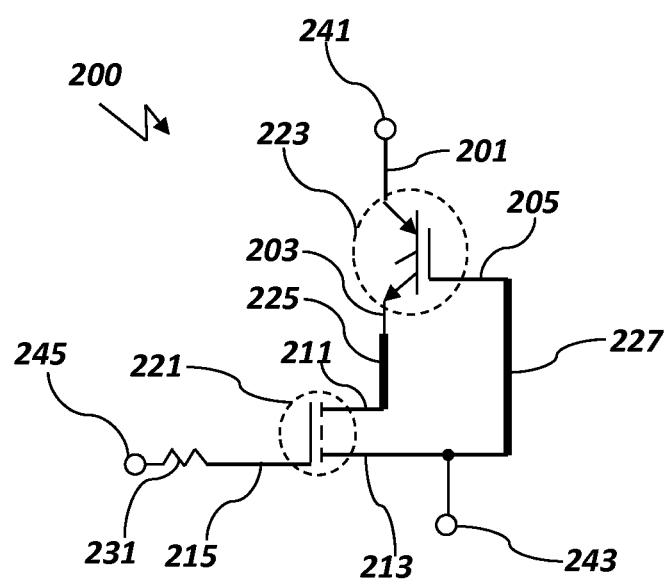
FIG. 1 is a schematic of an exemplary hybrid semiconductor bipolar switch in the form of a cascode configuration of a normally-on N-IGBT and a normally-off, n-channel MOSFET.

Normally-off (enhancement mode), high-voltage, wide-bandgap, semiconductor bipolar switches, such as IGBTs and thyristors, offer certain advantages when compared to bipolar silicon and unipolar wide-bandgap devices of with equivalent voltage ratings. The wide-bandgap bipolar switches provide lower power losses and higher operating frequencies. This in turn allows higher system efficiency, reduced weight, and/or smaller size. This is of particular interest for voltage ratings at which silicon switches face significant design challenges, e.g., above 6500 V. For example, the same blocking voltage may be achieved in silicon carbide (SiC) with drift layers that are about a tenth the thickness of those in analogous silicon devices. The SiC device will provide a much smaller device specific on-resistance, a smaller stored minority carrier charge, and a faster device turn-off time.

Nonetheless, SiC normally-off n-channel IGBTs (N-IGBTs) and MOSFETs have not yet received widespread adoption. This is due to reliability and performance problems, such as poor inversion channel mobility and higher operating gate biases, e.g., up to +20V (compared to under +15 volts for conventional normally-off silicon MOSFETs and IGBTs.) The higher operating gate bias of the SiC devices both complicates the gate driver needed and results in higher electric field across the gate oxide in SiC/SiO2 interface. The latter is associated with device reliability problems. A high electric field across the gate oxide promotes tunneling into the gate dielectric and activates additional traps within MOS interface. This in turn causes instabilities in SiC IGBT and MOSFET device performance, such as threshold voltage drifting and degradation of device on-resistance.

In contrast, normally-on (depletion-mode) bipolar switches devices, i.e., devices capable of conducting high rated current when a zero gate voltage signal is applied, have traditionally not been of commercial interest. By themselves, they do not offer fail-safe operation in practical power management systems. For example, they may short a high-voltage buss when a gate signal is lost, causing catastrophic system failure.

However, a hybrid switch using a cascode configuration with a normally-on bipolar switch controlled by a normally-off field-effect transistor (FET) will provide the desired fail-safe operation of power systems. The bipolar switch could be a high-voltage wide-bandgap bipolar switch, such as an IGBT or a thyristor. The FET could be a low-voltage, normally-off transistor, such as a MOSFET or JFET, made of narrow-bandgap material such as silicon or a wide-bandgap material such as SiC. A hybrid switch may be constructed using a p-channel FET in combination with a p-channel bipolar switch, or with a n-channel FET in combination with a n-channel bipolar switch.

Consider a hybrid switch made using a cascode configuration of a normally-on high-voltage SiC N-IGBT controlled by a low-voltage normally-off silicon n-channel MOSFET. Such a hybrid switch would exhibit low on-resistance, efficient conductivity modulation of the drift layer, and a high breakdown voltage. The low gate charge of the low-voltage silicon MOSFET, in combination with the speed of a SiC N-IGBT, would provide a very fast switching action for the hybrid switch. The use of a low-voltage MOSFET as the control device makes the hybrid switch compatible with conventional gate drivers, and therefore the hybrid switch would be a plug-in replacement for conventional silicon normally-off IGBTs. In addition, the normally-on nature of the N-IGBT does not necessarily require a high operating positive bias, and thus the hybrid switch may be suitable for higher operating temperatures and more immune to threshold voltage instabilities.

Example Schematic

FIG. 1 is a schematic of an exemplary high voltage hybrid semiconductor bipolar switch in the form of a Baliga-pair configuration IGBT-cascode 200 made from a normally-on high-voltage N-IGBT 223 and a normally-off low-voltage MOSFET 221. N-IGBT 223 and/or FET 221 may be made of silicon carbide. Interconnect 225 connects the emitter 203 of N-IGBT 223 to the drain 211 of FET 221, and interconnect 227 connects the gate 205 of N-IGBT 223 to the source 213 of FET 221. Terminal 243, which is common to gate 205 of N-IGBT 223 and source 213 of FET 221, acts as the source (low-side) terminal of the IGBT-cascode 200. Terminal 241, which connects to collector 201 of N-IGBT 223, is the collector (high-side) of the IGBT-cascode 200. Terminal 245, which connects to gate 215 of FET 221, acts as the gate terminal of the IGBT-cascode 200. The interconnects may be formed in any standard way, e.g., each interconnect may be one or more solder layers, ribbon- or wire-bonds, or combination thereof. The resistance of the interconnect bearing the highest current, interconnect 225, should be kept as low as may be practical, e.g., less than 1 milliohm. The switching dv/dt and di/dt of the cascode can be controlled, for example, by using an optional resistor 231 connected in series to the gate of FET 221.

Example Fabrication

Figure 2:
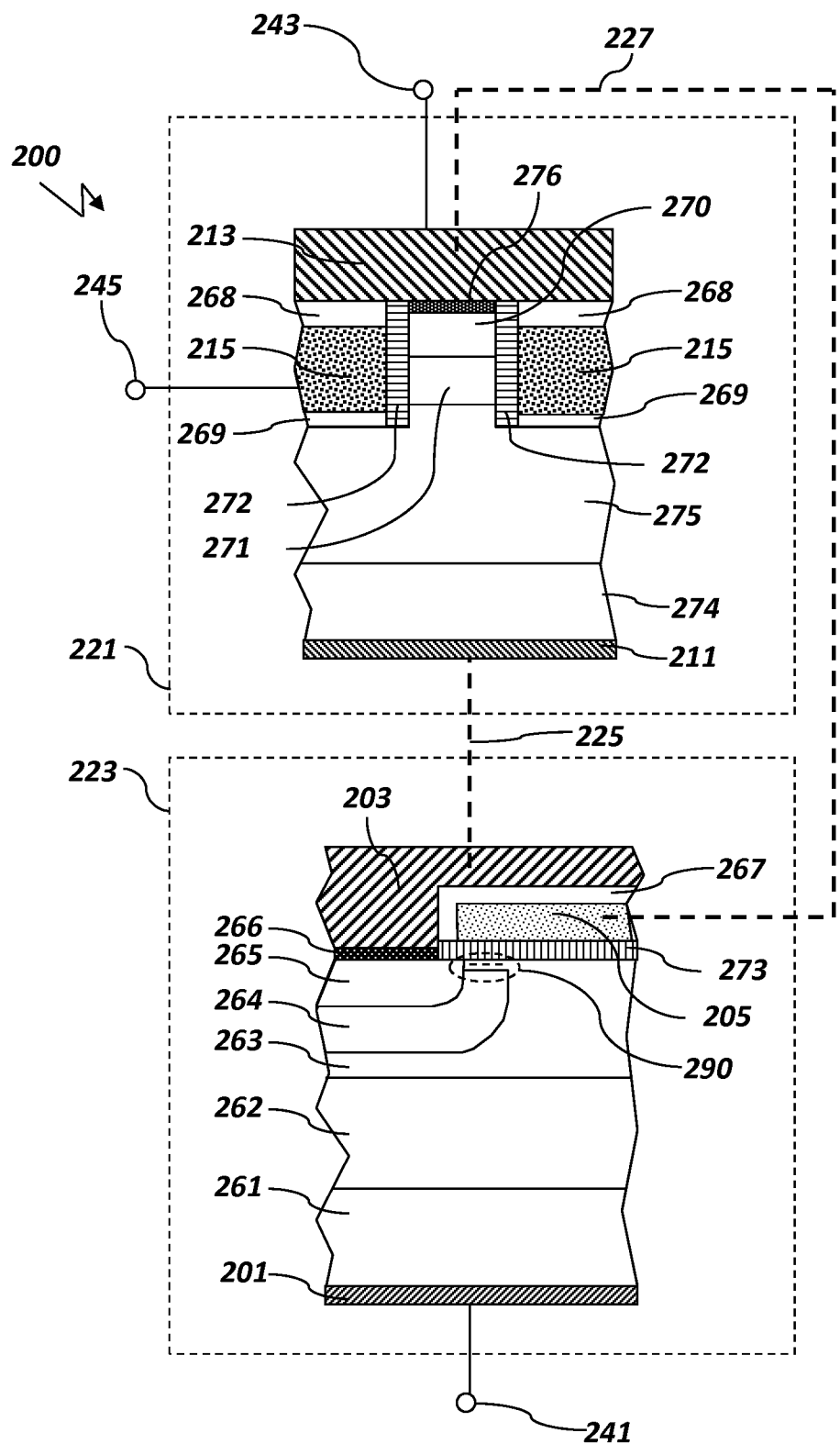
FIG. 2 shows cross-sectional views of an exemplary structures for a normally-on planar N-IGBT and a normally-off trench n-channel MOSFET, which can be combined with external interconnects to form an exemplary hybrid cascode switch.

FIG. 2 shows cross-sectional views of an exemplary structure for a hybrid switch made with a normally-on planar IGBT 223 and a normally-off trench MOSFET 221 combined in a cascode configuration through external interconnects. In FIG. 2, IGBT 223 is a planar, normally-on N-IGBT 223. This may be, for example, a high-voltage SiC, bipolar device. The FET 221 is a normally-off n-channel device. It may be, for example, a low-voltage, silicon device. Interconnect 225 connects emitter 203 of the N-IGBT 223 to drain 211 of the FET 221. Interconnect 227 connects the gate 205 of the N-IGBT 223 to the source 213 of the FET 221.

As depicted in FIG. 2, N-IGBT 223 may include a p-type injector 261, an n-type drift layer 262, a carrier-storage layer 263, a p-well 264, a planar MOS accumulation channel 290, an n-type emitter ion implantation layer 265, an emitter ohmic contact 266, a gate dielectric 273, and an interlayer dielectric 267.

As depicted in FIG. 2, FET 221 may include an n-type substrate 274, an n-type drift layer 275, a p-well 271, an n-type source layer 270, a source ohmic contact 276, a gate dielectric 272, a trench bottom dielectric 269, and an interlayer dielectric 268. The dielectric layers 272 and 269 may be formed of same material, such as thermally grown silicon dioxide, and the trench bottom may be rounded, e.g., as in a U-MOSFET.

Terminal 243, which is connected to the gate 205 of the N-IGBT 223 and the source 213 of the FET 221 via interconnect 227, is the source terminal of the IGBT-cascode 200. Terminal 241, which is connected to the collector 201 of the N-IGBT 223, is the collector terminal of the IGBT-cascode 200. The terminal 245, shared with MOSFET gate 215, is a gate terminal of the IGBT-cascode 200.

The IGBT may be designed to be normally-on by incorporating an accumulation channel 290 into the MOS-interface of the IGBT. The IGBT, compared to other types of bipolar switches, has both hole and electron currents flowing through the same terminals (emitter and collector). Further the IGBT has no DC current flowing through the gate which significantly simplifies the integration of the IGBT into the cascode. This is true whether a MOSFET or JFET is used as the control device.

Example Hybrid Switch Assembly

A hybrid semiconductor bipolar switch may be implemented by die-mounting a high-voltage normally-on bipolar switch chip and a low-voltage normally-off FET chip side-by-side on a metallized ceramic substrate board. Connections between the chips and to the substrate can be made, e.g., by wire-bonding. The ceramic material may be, for example, aluminum nitride, aluminum oxide, silicon nitride, or a similar material. The metallization on the ceramic board may be, for example, direct-bonded copper (DBC), actively-brazed copper (ABC), a molybdenum-based alloy, etc., any of which may be combined with titanium, tungsten, nickel, platinum, and/or gold coatings to facilitate die-attach and/or prevent inter-diffusion and oxidation of various metallization layers. Similarly, various coatings may be overlayed on the semiconductor chips where they are to be attached and/or bonded.

Figure 3:
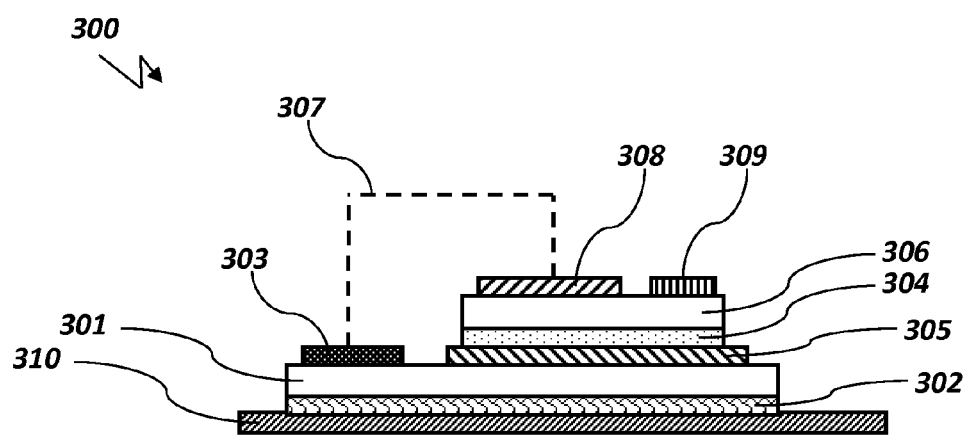
FIG. 3 is a cross-sectional view of an exemplary stacked cascode comprising a normally-off FET chip mounted on a normally-on bipolar switch chip.

A hybrid switch may also be implemented as a "stacked" device by directly mounting a low-voltage normally-off FET chip onto a bonding pad of a high-voltage normally-on bipolar switch chip. FIG. 3 is a cross-sectional view of an example of such a device. As depicted in FIG. 3, a normally-on bipolar switch chip 301 has a bonding pad 305 for a low voltage, high-current connection. The bonding pad 305 could connect, for example, to the emitter of an IGBT on chip 301. Chip 301 may be attached to a metallic surface 310 using a die attach material 302, such as a solder or conductive adhesive. The metallic surface 310 could be, e.g., part of an insulating ceramic board or a lead-frame. A low-voltage normally-off FET chip 306 may be mounted with a die attach material 304 onto the bonding pad 305. A gate terminal 309 of FET chip 306 is used for gate control of stacked cascode 200. A source terminal 308 of FET chip 306 is connected to a gate terminal 303 of the normally-on bipolar switch chip 301 via an interconnect 307. In this configuration, parasitic series resistance and inductance of the high-current interconnect between normally-on bipolar switch 301 and low-voltage normally-off switch 306 will be minimized, thereby reducing undesirable voltage overshoots during switching under high di/dt and dv/dt conditions.

A stacked cascode hybrid switch implemented with SiC normally-on bipolar switch may offer improved reliability compared to a conventional normally-off SiC planar double-implanted MOSFET (DI-MOSFET). In a DI-MOSFET, the MOSFET channel is defined between the boundaries of p-well and n-type source ion implanted regions. The power dissipation in a stacked cascode with a SiC bipolar switch is largely in the SiC bipolar switch, which is capable of higher peak junction temperatures than the DI-MOSFET. Where the stacked cascode hybrid switch is implemented using a silicon MOSFET to control the bipolar switch, the silicon MOSFET operates at the average temperature of the SiC chip (since it is stacked on top of the bipolar switch) but not at the peak temperature junction temperature of the bipolar device. Low voltage silicon devices are readily available for 175° C. operation, and may be designed for 200° C. operation if packaging technology permits. Further, poor inversion MOS channel mobility in the SiC DI-MOSFET typically forces designers to use shorter MOS channels. This can make DI-MOSFET devices vulnerable to drain-induced barrier lowering, and catastrophic failure under short-circuit conditions, when high heat is generated within the device. In contrast, where a SiC IGBT is used as the bipolar switch of the stacked cascode, high carrier mobility in the accumulation MOS channel of the IGBT can allow use of a longer MOS channel, reducing drain-induced barrier lowering effect and improving the short-circuit capability compared to the inversion-channel of the DI-MOSFET. During short-circuit, the bipolar switch is rapidly de-biased, and industry-standard 10 microseconds (us) short-circuit withstand times can be achieved, with power dissipation largely confined to the SiC IGBT for such short time durations.

Other options for hybrid switch assemblies include using thyristors in place of the IGBTs, using JFETs in place of MOSFETS, and for all configurations using p-channel devices in place of n-channel devices.

Example Bridge

Figure 4:
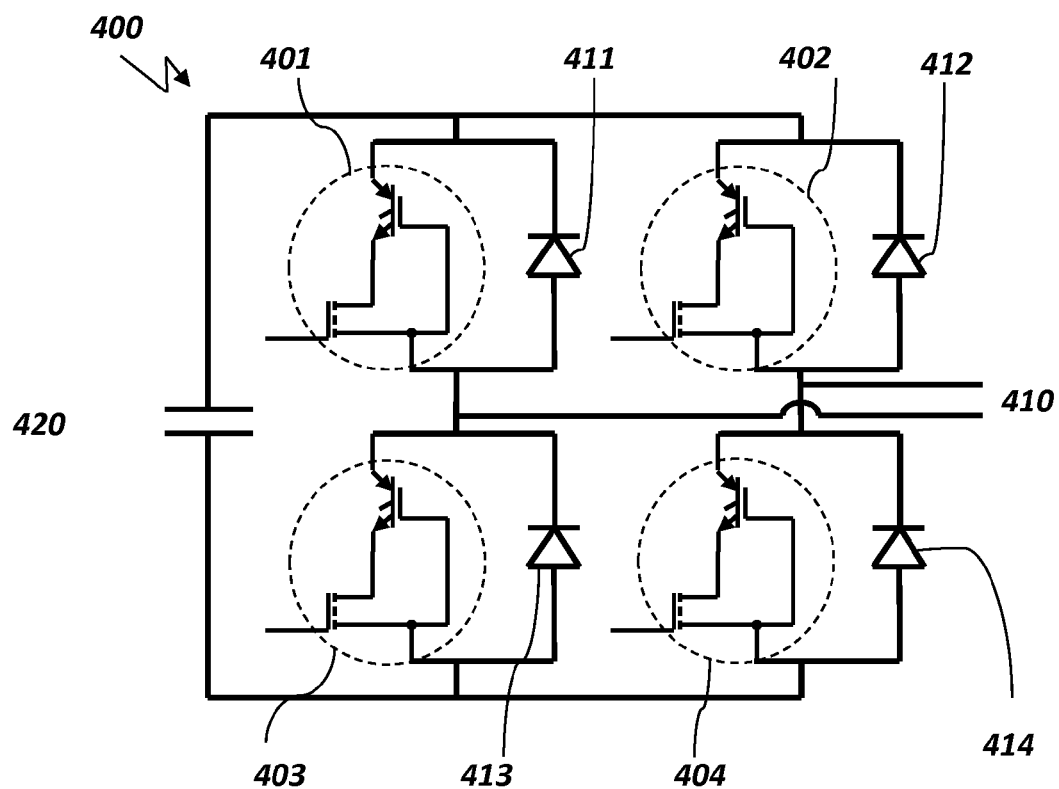
FIG. 4 is a schematic of an exemplary full bridge circuit schematic, where a hybrid wide-bandgap semiconductor bipolar switch is being used with an anti-parallel diode.

FIG. 4 is a schematic of an exemplary full bridge circuit 400. As depicted in FIG. 4, the bridge circuit 400 includes four hybrid wide-bandgap semiconductor bipolar switches 401 to 404 paired with four anti-parallel diodes 411 to 414. The input is across capacitor 420 and the output of the circuit is at connections 410. In such a circuit, the switches are being turned on and off in a specific sequence to provide required output voltage and current to a load (not shown), and each anti-parallel diode is providing a current flow path when its complimentary switch turns off. In FIG. 4, the hybrid wide-bandgap semiconductor bipolar switches are shown as n-channel IGBT devices and the FETs as n-channel MOSFETs. Other options for bridges include using thyristors in place of the IGBTs, using JFETs in place of MOSFETS, and for all configurations using p-channel devices in place of n-channel devices.

The antiparallel diodes may be integral to the switches or external discrete devices. For example, a hybrid wide-bandgap semiconductor bipolar switch may have a monolithically integrated antiparallel diode within the low-voltage FET, e.g., formed between the p-body and the drain of the FET. Alternatively, such as in hard switched applications, using an external unipolar diode, such as a Schottky or Junction-Barrier Schottky (JBS) device, may be beneficial because doing so reduces switching losses related to diode recovery, and thereby allows higher frequency operation, smaller passive components, and lower cooling requirements.

The built-in body diode of a silicon MOSFET can eliminate the need for an external anti-parallel diode in practical power conversion circuits. The stored charge in the low voltage Silicon MOSFET body diode can be extremely small, which is useful in high volume synchronous rectification applications, for example. The optional external anti-parallel diode may nevertheless be implemented based on specific circuit requirements.

In addition to full bridge circuits, hybrid wide-bandgap semiconductor bipolar switches may be paired with antiparallel diodes in the same fashion in half-bridges, three phase bridges, and multi-level converter circuits, among others.

Configuration Options

There are many options for how a hybrid device may be constructed. The hybrid switch includes a normally-off (enhancement-mode) field effect transistor with a source, a drain, and a gate. This could be a low-voltage MOSFET or a JFET. It could be of any channel type. It could be made of a narrow bandgap material such as silicon, or a wide-bandgap material such as SiC, gallium nitride (GaN), and diamond. It may have a threshold voltage, rated at maximum operating junction temperature, within the range of about +1V to about +10V, allowing it to be operated by conventional gate drivers. At maximum operating junction temperature it may have a drain-to-source voltage rating of from about +1V to about +200V.

The hybrid switch includes a bipolar switch. The bipolar switch would be a normally-on (depletion-mode) wide-bandgap semiconductor device with a low voltage terminal, a high-voltage terminal, and a switch gate terminal. The bipolar switch may be, for example, an IGBT or thyristor, such as a static-induction (field-controlled) thyristor. The bipolar switch may be of any channel type. It may have a threshold voltage, rated at maximum operating junction temperature, in the range of about −20V to about 0V. At maximum operating junction temperature it may have a high-voltage terminal to low-voltage terminal voltage rating in the range of about +1V to about +50,000V. The wide-bandgap material could be 4H-SiC, 6H-SiC, 3C-SiC, GaAs, GaN, InP, AlN, diamond, etc., or any combination thereof.

The transistor and the bipolar switch are connected in a cascode (Baliga pair) configuration. The low-voltage terminal of the bipolar switch is connected to the drain of the transistor, and the switch gate terminal is connected to the source of the transistor. Operation of the hybrid semiconductor device is thereby controlled via the gate of the transistor. A resistor may be connected to the gate of the transistor to adjust the response of the transistor to an input voltage.

For example, the hybrid switch could be made using an n-channel IGBT as the bipolar switch, such that the low voltage terminal is the emitter of the IGBT, the high-voltage terminal is the collector of the IGBT, and the switch gate terminal is the gate of the IGBT. The transistor could be a silicon MOSFET, such that the emitter of the IGBT is connected to the drain of the MOSFET, and the gate of the IGBT is connected to the source of the MOSFET.

If this hybrid switch is constructed as a stacked device, the silicon MOSFET transistor is on a discrete chip with a backside drain connection. That backside connection is bonded directly onto an IGBT chip where the IGBT chip has a bonding pad connected to the emitter of the IGBT. The die attach could be achieved using die attach materials, or by other means, such as ultrasonic bonding. The connection of the switch gate terminal to the source of the transistor is achieved with one or more wire bonds, ribbon bonds, or solder bonds, in addition to metallization layers on the IGBT chip and/or MOSFET chip.

If an anti-parallel diode is used, the anode of the anti-parallel diode is connected to the emitter of the IGBT and the cathode of the anti-parallel diode is connection is connected to collector of the IGBT. A bridge circuit could then be constructed using multiple hybrid switches of this kind.

A hybrid semiconductor bipolar switch circuit may be a combination of any normally-on bipolar switch and any normally-off FET. For example, the normally-on bipolar switch may be a normally-on IGBT or a normally-on static-induction (field-controlled) thyristor. It is noted that such a thyristor may require a high gate current pulse to trigger its turn-on and turn-off transients. Stray resistance and inductance of the interconnect between the gate of thyristor and the source of the low-voltage enhancement mode FET may therefore generate significant instabilities in the circuit during high di/dt and dv/dt transients.

The normally-off, low-voltage FET may be, for example, a MOSFET or a JFET. Since the operating junction temperature of a silicon FET is typically limited to 175 degrees Celsius, a higher operating temperature, may be achieved, for example, by using a SiC JFET or MOSFET. Using a SiC FET may require a more complex gate driver, e.g., a gate driver that handles more voltages or different voltages than a driver for silicon FET levels.

Hybrid switches may be designed and manufactured for various operating voltage ratings, such as above 50V. Ratings of 6.5 kV and above are of particular interest in many power applications where these devices offer lower device specific on-resistance, and hence smaller die size for the same current rating, compared to those of silicon bipolar or unipolar SiC counterparts of the same voltage rating. Operating voltage ratings as high as 20 kV can be achieved using state-of-the-art SiC epitaxial growth. Ratings of up to 50 kV may be achieved using the thick epitaxial growth of 4H-SiC material combined with IGBT and thyristor technology. The voltage rating of the cascode is determined by blocking capability of a normally-on bipolar switch.

A typical operating voltage rating of a low-voltage normally-off MOSFET can be up to about 25V. Other voltage ratings of a low-voltage normally-off MOSFET can be up to 50 V or even 200 V.

The rated threshold voltage of low-voltage normally-off MOSFET maybe within +1 Volt to +10 Volts, while the rated threshold voltage of high-voltage normally-on bipolar switch maybe within −20 Volt to 0 V. The threshold voltages and resistance value of cascode interconnects may be optimized for specific turn-on and turn-off requirements. For instance, the turn-on time of a cascode may be reduced by making threshold voltage of a normally-on bipolar switch more negative. At the same time, more negative threshold voltage of a normally-on switch, will have minor effect on a turn-off behavior. It is important to maintain safe margin below the breakdown rating of a gate terminal of a bipolar switch. Increasing turn-on time may be accomplished by increasing the internal gate resistance of a high-voltage normally-on bipolar switch, as it will increase Rg*Cgs time constant, where Cgs is the gate-source capacitance, or by adding external gate resistor to the cascode gate terminal.

We claim:

1. A stacked hybrid device comprising:
    a transistor, the transistor being a normally-off silicon carbide field effect device comprising a source, a drain, and a gate of the transistor, the transistor being a discrete chip comprising a backside drain connection; and
    a bipolar switch, the bipolar switch being a normally-on silicon carbide n-channel IGBT comprising an emitter, a collector, and a switch gate terminal, the bipolar switch comprising a top side emitter bonding pad and a backside collector connection;
    wherein:
    the backside drain connection is conductively bonded directly to the emitter bonding pad using a die attach material; and
    the switch gate terminal is connected to the source, such that operation of the stacked hybrid device is controlled via the gate of the transistor.

2. The stacked hybrid device of claim 1, further comprising an anti-parallel diode, wherein the anti-parallel diode comprises an anode and a cathode, the anode is connected to the source, and the cathode is connected to the collector.

3. The stacked hybrid device of claim 1, wherein the transistor is a silicon carbide MOSFET.

4. The stacked hybrid device of claim 1, wherein the transistor is a silicon carbide JFET.

5. A stacked hybrid device, comprising:
    a transistor, the transistor being a normally-off silicon field effect device comprising a source, a drain, and a gate of the transistor, the transistor being a discrete chip comprising a backside drain connection; and
    a bipolar switch, the bipolar switch being a normally-on silicon carbide n-channel IGBT comprising an emitter, a collector, and a switch gate terminal, the bipolar switch comprising a top side emitter bonding pad and a backside collector connection;
    wherein:
    the backside drain connection is conductively bonded directly to the emitter bonding pad using a die attach material; and
    the switch gate terminal is connected to the source, such that operation of the stacked hybrid device is controlled via the gate of the transistor.

6. The stacked hybrid device of claim 5, further comprising an anti-parallel diode, wherein the anti-parallel diode comprises an anode and a cathode, the anode is connected to the source, and the cathode is connected to the collector.

7. The stacked hybrid device of claim 5, wherein the transistor is a silicon MOSFET.

8. The stacked hybrid device of claim 5, wherein the transistor is a silicon JFET.

* * * * *